(12) United States Patent
Falvo et al.

(10) Patent No.: US 10,497,621 B2
(45) Date of Patent: Dec. 3, 2019

(54) METHOD FOR DICING A SUBSTRATE WITH BACK METAL

(71) Applicant: Plasma-Therm, LLC, St. Petersburg, FL (US)

(72) Inventors: Peter Falvo, St. Petersburg, FL (US); Linnell Martinez, Lakeland, FL (US); David Pays-Volard, St. Petersburg, FL (US); Rich Gauldin, St. Petersburg, FL (US); Russell Westerman, Land O'Lakes, FL (US)

(73) Assignee: Plasma-Therm LLC, St. Petersburg, FL (US)

( * ) Notice: Subject to any disclaimer, the term of this patent is extended or adjusted under 35 U.S.C. 154(b) by 0 days.

(21) Appl. No.: 15/148,707

(22) Filed: May 6, 2016

(65) Prior Publication Data

US 2016/0254189 A1   Sep. 1, 2016
US 2018/0254215 A9   Sep. 6, 2018

Related U.S. Application Data

(62) Division of application No. 14/034,164, filed on Sep. 23, 2013, now Pat. No. 9,368,404.

(Continued)

(51) Int. Cl.
*H01L 21/78*   (2006.01)
*H01L 21/683*   (2006.01)
(Continued)

(52) U.S. Cl.
CPC .............. *H01L 21/78* (2013.01); *B28D 5/00* (2013.01); *H01L 21/02052* (2013.01);
(Continued)

(58) Field of Classification Search
None
See application file for complete search history.

(56) References Cited

U.S. PATENT DOCUMENTS

| 4,729,971 A | * | 3/1988 | Coleman | H01L 21/78 |
| | | | | 257/E21.238 |
| 5,401,690 A | * | 3/1995 | Chen | H01L 21/3046 |
| | | | | 257/E21.239 |

(Continued)

FOREIGN PATENT DOCUMENTS

| JP | 2008016673 A | * | 1/2008 |
| JP | 2009260094 A | * | 11/2009 |

OTHER PUBLICATIONS

Machine translation of JP2008-016673A.*

(Continued)

*Primary Examiner* — Erik T. K. Peterson
(74) *Attorney, Agent, or Firm* — Burr & Forman LLP; Harvey S. Kauget

(57) ABSTRACT

The present invention provides a method for dicing a substrate with back metal, the method comprising the following steps. The substrate is provided with a first surface and a second surface wherein the second surface is opposed to the first surface. A mask layer is provided on the first surface of the substrate and a thin film layer is provided on the second surface of the substrate. The first surface of the substrate is diced through the mask layer to expose the thin film layer on the second surface of the substrate. A fluid from a fluid jet is applied to the thin film layer on the second surface of the substrate after the thin film layer has been exposed by the dicing step.

13 Claims, 4 Drawing Sheets

Related U.S. Application Data

(60) Provisional application No. 61/707,464, filed on Sep. 28, 2012.

(51) Int. Cl.
  B28D 5/00 (2006.01)
  H01L 21/02 (2006.01)
  H01L 21/3213 (2006.01)

(52) U.S. Cl.
  CPC .... H01L 21/32136 (2013.01); H01L 21/6831 (2013.01); H01L 21/7813 (2013.01)

(56) References Cited

U.S. PATENT DOCUMENTS

| | | | | |
|---|---|---|---|---|
| 6,521,513 | B1* | 2/2003 | Lebens | B81C 1/00873 257/620 |
| 7,723,718 | B1* | 5/2010 | Doan | H01L 33/0079 257/14 |
| 2010/0120230 | A1* | 5/2010 | Grivna | H01L 21/78 438/464 |
| 2012/0168714 | A1* | 7/2012 | Chu | H01L 33/0079 257/13 |
| 2013/0337633 | A1* | 12/2013 | Seddon | H01L 21/78 438/462 |
| 2014/0051232 | A1* | 2/2014 | Burghout | H01L 21/02076 438/460 |

OTHER PUBLICATIONS

Disco Corporation product literature for DCS 1440/1460 Automatic Cleaning System, retrieved from Internet Archive Wayback Machine (web capture from Dec. 27, 2010), http://web.archive.org/web/20110125053950/http://www.disco.co.jp/eg/products/catalog/pdf/dcs1440.pdf.*

* cited by examiner

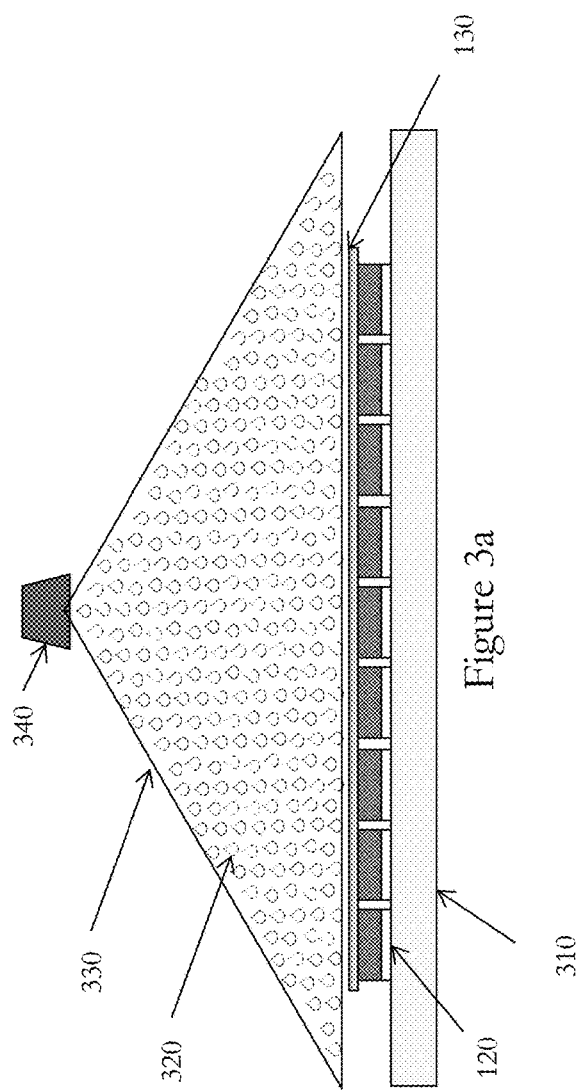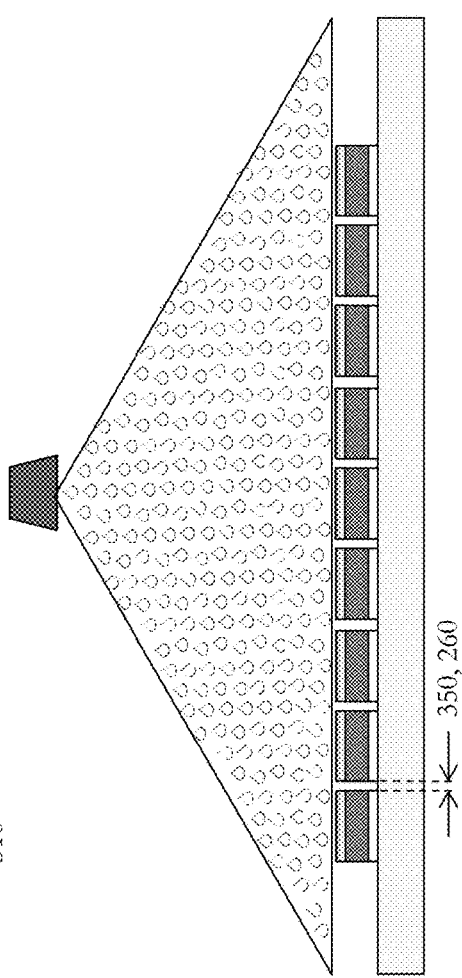

Plasma Dicing

- A device substrate is masked with a suitable mask material and pattern; Substrate has a un-patterned backmetal thin film
- Mount the substrate on a dicing tape
- Etch street regions with a plasma to expose the backmetal
- Apply a water jet to the back metal to finalize the singulation of the die

Figure 4

METHOD FOR DICING A SUBSTRATE WITH BACK METAL

CROSS REFERENCES TO RELATED APPLICATIONS

This utility patent application is a divisional of commonly owned U.S. Utility patent application Ser. No. 14/034,164 entitled: Method for Dicing a Substrate with Back Metal which was filed based on commonly owned U.S. Provisional Patent Application Ser. No. 61/707,464 filed Sep. 28, 2012, entitled: Method for Dicing a Substrate with Back Metal, the prior Utility Patent Application and Provisional Patent Application incorporated by reference herein.

BACKGROUND OF THE INVENTION

Field of the Invention

The invention relates to semiconductor wafer processing and, more particularly, to a method and apparatus for dicing semiconductor wafer into a plurality of individual dice.

Description of the Related Art

Semiconductor die such as diodes, transistors and the like are commonly processed (formed) simultaneously in a large area wafer. Such wafers may be made of monocrystaline silicon or other materials, such as gallium nitride on a suitable substrate such as silicon or the like.

Plasma etching equipment is used extensively in the processing of these substrates to produce semi-conductor devices. Such equipment typically includes a vacuum chamber fitted with a high density plasma source such as an Inductively Coupled Plasma (ICP) which is used to ensure high etch rates, necessary for cost-effective manufacturing. In order to remove the heat generated during the processing, the wafer (substrate) is typically clamped to a cooled support. A cooling gas (typically Helium) is maintained between the substrate and the support to provide a thermal conductance path for heat removal. A mechanical clamping mechanism, in which a downward force is applied to the top side of the substrate, may be used, though this may cause contamination due to the contact between the clamp and the substrate. More frequently an electrostatic chuck (ESC) is used to provide the clamping force.

After the processing steps are completed, the wafers are singulated, separating the die from the wafer. This "dicing," separation or singulating operation is commonly carried out by sawing through the "streets" between the die within the wafers. Singulating the die of the wafer, for example, by sawing the wafer along the streets after the wafer is complete, including metal layers on the back or front side, can be a time consuming and costly process. Further, the singulation process can damage portions of the die, including the sides of the die.

Because of the potential damage, additional spacing is required between the dice on the wafer to prevent damage to the integrated circuits, e.g., the chips and cracks are maintained at a suitable distance from the actual integrated circuits so that the defects do not impair circuit performance or reliability. As a result of the spacing requirements, not as many dice can be formed on a standard sized wafer and wafer area that could otherwise be used for circuitry is wasted. The use of a saw exacerbates the loss of real estate on a semiconductor wafer. The blade of the saw is approximately fifteen microns thick. As such, to insure that cracking and other damage surrounding the cut made by the saw does not harm the integrated circuits, approximately one to five hundred microns of separation is typically maintained between the circuitry of each of the dice. Furthermore, after cutting, the dice require substantial cleaning to remove particles and other contaminants that result from the sawing process.

In an effort to overcome the disadvantages of sawing and scribing, chemical etching has been considered as an alternative for die singulation. Two methods of separating die by chemical etching are wet etching and plasma etching. Wet chemical etching techniques require an etch mask to be formed on at least one side of the wafer and, in some embodiments, both sides of the wafer. The etch mask defines where the substrate will be etched and protects the integrated circuits from the etchant. Once the mask is in place, the wafer is to be immersed in a wet etchant such as potassium hydroxide in the case silicon substrates. The wet etchant removes the substrate material from between the dice such that the dice are separated from one another. In the case of a silicon substrate, a wet etch technique is capable of removing silicon at a rate of about thirty microns per hour. Thus, even a wafer that has been thinned to a thickness of about two hundred microns will require about seven hours to complete the dicing process. Furthermore, there are well-known disadvantages to wet etch techniques such as the trenches formed with a wet etch do not have substantially vertical sidewalls, the trenches are relatively wide and, to achieve deep vertically directed trenches, the semiconductor wafer can only have certain specific crystal orientations. Additionally, some materials, such as GaN, can be difficult to wet etch with high enough rates to be economically feasible in a manufacturing process. Therefore, there is a need in the art for a method and apparatus for dicing a semiconductor wafer using a smaller separation between the dice and a fast dicing process.

Recently plasma etching techniques have been proposed as a means of separating die and overcoming some of these limitations. After device fabrication, the substrate is masked with a suitable mask material, leaving open areas between the die. The masked substrate is then processed using a reactive-gas plasma which etches the substrate material exposed between the die. The plasma etching of the substrate may proceed partially or completely through the substrate. In the case of a partial plasma etch, the die are separated by a subsequent cleaving step, leaving the individual die separated. The plasma etching technique offers a number of benefits over mechanical dicing:

1) Breakage and chipping is reduced;
2) The kerf or street dimensions between die can be reduced to well below twenty microns;
3) Processing time does not increase significantly as the number of die increases;
4) Processing time is reduced for thinner wafers; and
5) Die topology is not limited to a rectilinear format.

For wafers that have back side metallization, die singulation is more complex. Back metal wafer dicing can be done with conventional sawing techniques though lower saw speeds and more frequent blade changes are required. Back metal dicing represents a bigger challenge for plasma etching techniques. Plasma etching systems are material dependent such that systems that are capable to etch through semiconductor materials like silicon, gallium arsenide, and sapphire, are not typically capable of etching through metals or metal alloys—particularly metals typically used in back metal stacks (e.g., gold, silver, copper and nickel). Hence, a plasma system that can etch wafers for dicing is may not be well suited to etch metals or metal alloys, thus a second etching tool may be required. To add further complexity to back metal dry etching, plasma etching through metals typically has a very narrow process window with the complications of potential for sputtering of the etched metal onto the side of the newly singulated die which may ultimately compromise device performance or reliability. Furthermore, it may be possible to etch the back metal prior to plasma etching the street regions. While this approach would avoid metal byproduct re-deposition on the singulated die walls, it represents an additional etch step that would require an aligned mask patterns on the back of the wafer.

Nothing in the prior art provides the benefits attendant with the present invention.

Therefore, it is an object of the present invention to provide an improvement which overcomes the inadequacies of the prior art devices and which is a significant contribution to the advancement to the dicing of semiconductor substrates using a plasma etching apparatus.

Another object of the present invention is to provide a method for dicing a substrate with back metal, the method comprising: providing the substrate having a first surface and a second surface, said second surface being opposed to said first surface, a mask layer on said first surface of the substrate, a thin film layer on said second surface of the substrate; dicing said first surface of the substrate through said mask layer to expose said thin film layer on said second surface of the substrate; and applying a fluid from a fluid jet to said thin film layer on said second surface of the substrate after said thin film layer has been exposed by the dicing step.

Yet another object of the present invention is to provide a method for dicing a substrate with back metal, the method comprising: providing a process chamber having a wall; providing a plasma source adjacent to the wall of the process chamber; providing a substrate support within the process chamber; providing the substrate having a first surface and a second surface, said second surface being opposed to said first surface, a mask layer on said first surface of the substrate, a thin film layer on said second surface of the substrate; placing the substrate onto said substrate support; generating a plasma using the plasma source; etching said first surface of the substrate through said mask layer using the generated plasma, the etching step exposing said thin film layer on said second surface of the substrate; and applying a fluid from a fluid jet to said thin film layer on said second surface of the substrate after said thin film layer has been exposed by the etching step.

Still yet another object of the present invention is to provide a method for dicing a substrate, the method comprising: providing a process chamber having a wall; providing a plasma source adjacent to the wall of the process chamber; providing a work piece support within the process chamber; providing the substrate having a first surface and a second surface, said second surface being opposed to said first surface, a mask layer on said first surface of the substrate, and a thin film layer on said second surface of the substrate; placing a work piece onto said work piece support, said work piece having a support film, a frame and the substrate; generating a plasma using the plasma source; etching said first surface of the substrate through said mask layer using the generated plasma, the etching step exposing said thin film layer on said second surface of the substrate; and applying a fluid from a fluid jet to said thin film layer on said second surface of the substrate after said thin film layer has been exposed by the etching step.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The present invention describes a plasma processing apparatus which allows for plasma dicing of a semiconductor substrate. After device fabrication and wafer thinning, the front side (circuit side) of the substrate is masked using conventional masking techniques which protects the circuit components and leaves unprotected areas between the die. The substrate is mounted on a thin tape which is supported within a rigid frame. The substrate/tape/frame assembly is transferred into a vacuum processing chamber and exposed to reactive gas plasma where the unprotected areas between the die are etched away. During this process, the frame and tape are protected from damage by the reactive gas plasma. After deep silicon etching of the substrate is accomplished using a plasma, a fluid jet is used to separate the back metal on the substrate.

Another feature of the present invention is to provide a method for dicing a substrate with back metal, the method comprising the following steps. The substrate is provided with a first surface and a second surface wherein the second surface is opposed to the first surface. A mask layer is provided on the first surface of the substrate and a thin film layer is provided on the second surface of the substrate. The thin film layer can further comprise a metal layer which can be approximately one to five microns thick. The first surface of the substrate is diced through the mask layer to expose the thin film layer on the second surface of the substrate. A plasma deep silicon etch process can be employed to accomplish the dicing. A fluid from a fluid jet is applied to the thin film layer on the second surface of the substrate after the thin film layer has been exposed by the dicing step. The fluid from the fluid jet can be dispensed on an area on the substrate wherein the area is greater than a street width on the substrate. The fluid from the fluid jet can have a jet diameter wherein the jet diameter is greater than a die diameter on the substrate. The fluid jet can be pulsed during the application of the fluid to the thin film layer. The fluid from the fluid jet can be dispensed asymmetrically during the application of the fluid to the thin film layer. The fluid from the fluid jet can further comprise a liquid. The fluid from the fluid jet can further comprise water. The fluid from the fluid jet can further comprise a solid. The fluid from the fluid jet can further comprise a gas. The fluid from the fluid jet can further comprise a liquid. The fluid from the fluid jet can further comprise a solid. The fluid jet can remove a portion of the thin film layer during the application of the fluid to the thin film layer. The etching step can leave a portion of the thin film layer. The etching step can be selective to the thin film layer. The method can further comprise exposing the thin film layer from the first surface.

Yet another feature of the present invention is to provide a method for dicing a substrate with back metal, the method comprising the following steps. A process chamber having a wall is provide. A plasma source adjacent to the wall of the process chamber is provided. A substrate support within the process chamber is provided. The substrate having a first surface and a second surface is provided wherein the second surface is opposed to the first surface. A mask layer is provided on the first surface of the substrate. A thin film layer is provided on the second surface of the substrate. The substrate is placed onto the substrate support. A plasma is generated using the plasma source. The first surface of the substrate is etched through the mask layer using the generated plasma. The etching step exposes the thin film layer on the second surface of the substrate. A fluid from a fluid jet is applied to the thin film layer on the second surface of the substrate after the thin film layer has been exposed by the etching step. The fluid jet can be pulsed during the application of the fluid to the thin film layer. The fluid from the fluid jet can be dispensed asymmetrically during the application of the fluid to the thin film layer. The fluid from the fluid jet can further comprise a liquid. The etching step can leave a portion of the thin film layer. The etching step can be selective to the thin film layer. The method can further comprise exposing the thin film layer from the first surface.

Still yet another feature of the present invention is to provide a method for dicing a substrate, the method comprising the following steps. A process chamber having a wall is provided. A plasma source adjacent to the wall of the process chamber is provided. A work piece support within the process chamber is provided. The substrate having a first surface and a second surface is provided wherein the second surface is opposed to the first surface. A mask layer is provided on the first surface of the substrate and a thin film layer is provided on the second surface of the substrate. A work piece is placed onto the work piece support wherein the work piece has a support film, a frame and the substrate. A plasma is generated using the plasma source. The first surface of the substrate is etched through the mask layer using the generated plasma. The etching step exposes the thin film layer on the second surface of the substrate. A fluid is applied from a fluid jet to the thin film layer on the second surface of the substrate after the thin film layer has been exposed by the etching step. The fluid jet can be pulsed during the application of the fluid to the thin film layer. The fluid from the fluid jet can be dispensed asymmetrically during the application of the fluid to the thin film layer. The fluid from the fluid jet can further comprise a liquid. The etching step can leave a portion of the thin film layer. The etching step can be selective to the thin film layer. The method can further comprise exposing the thin film layer from the first surface.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 3a is a cross-sectional view of a fluid jet being applied to back metal on a semiconductor wherein the semiconductor substrate has been previously diced according to an embodiment of the present invention;

FIG. 3b is a cross-sectional view of a fluid jet being applied to back metal on a semiconductor wherein the semiconductor substrate has been previously diced according to an embodiment of the present invention; and FIG. 4 is a flow chart of a method to a fluid jet to back metal of a plasma diced substrate to finalize the singulation of the die.

Similar reference characters refer to similar parts throughout the several views of the drawings.

DETAILED DESCRIPTION OF THE INVENTION

A method of singulating the die of the wafer will now be described. Silicon devices are typically fabricated on silicon wafers. Many die are typically present on one wafer. These die can be various sizes and shapes. It is possible to have different die types within the same wafer. In order to make a useful device, the individual die must be separated from the wafers. In order to accomplish this, non-functional areas of the wafer are purposely left between the devices. These areas are known as street regions or kerfs. These street regions are typically removed during the die singulation process. This material removal can be accomplished in a number of ways including sawing, laser cutting (stealth and ablation) and plasma etching.

A common practice in semiconductor device production is to coat the back of the wafer with a metal alloy, usually made up but not limited to aluminum, silver, gold, copper, nickel, and/or titanium. The purpose of the back metal is to provide a conductive layer for soldering die to die and/or a package in order to create a product. This coating is typically done via plasma vapor deposition, sputtering and/or e-beam evaporation. The back metal plating step is usually done prior to any micro machining. Typical back metal thicknesses are usually between one to ten microns.

Figure 1B:
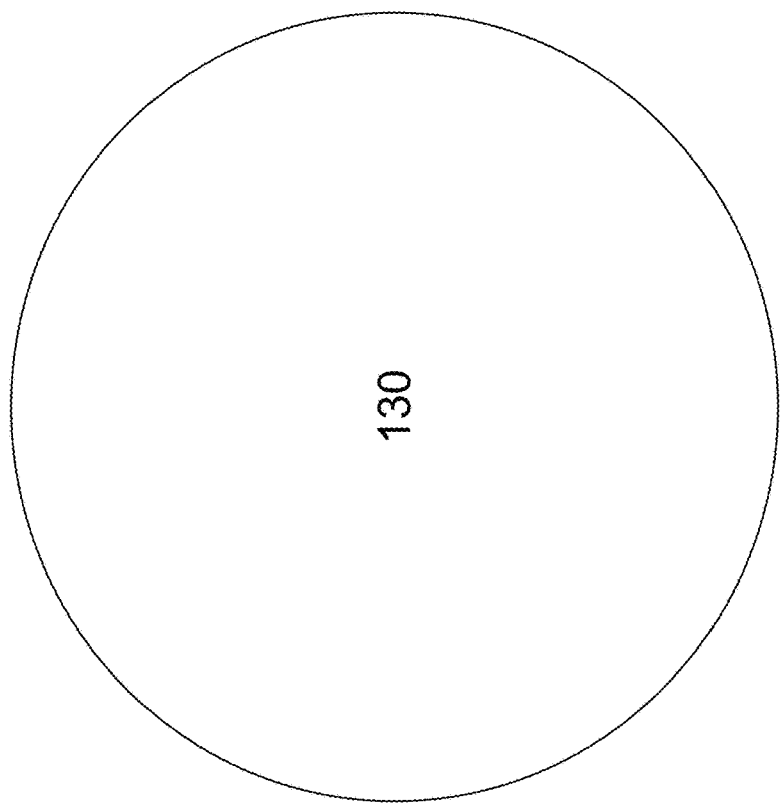
FIG. 1b is a top down view of a semiconductor substrate illustrating a back metal layer on the back side of the substrate.
Figure 1A:
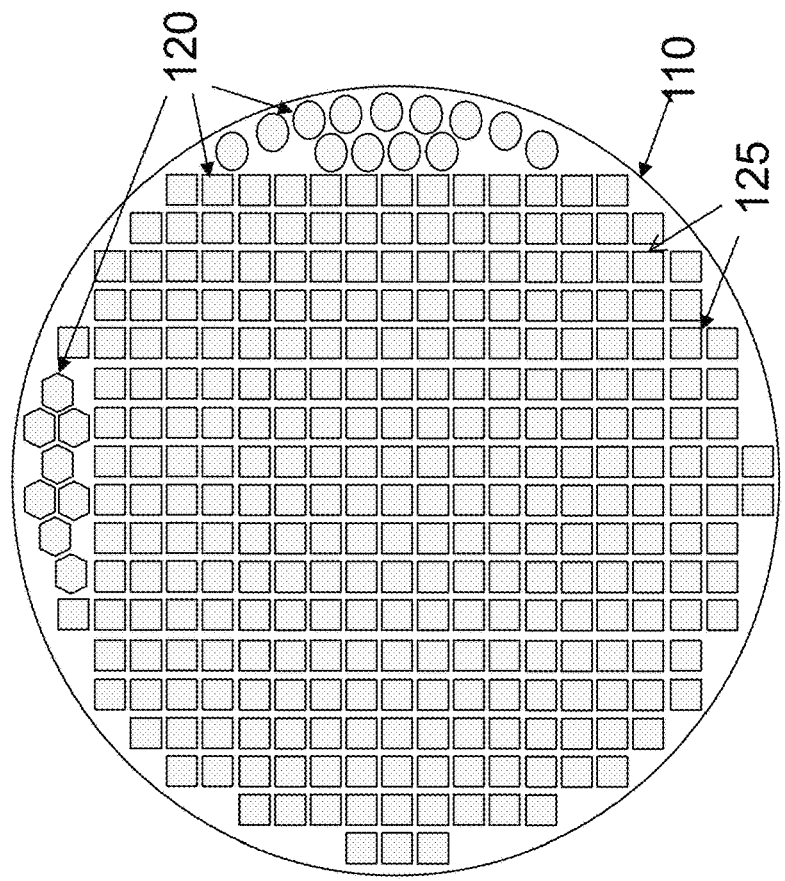
FIG. 1a is a top down view of a semiconductor substrate illustrating individual devices separated by streets on the front side of the substrate.

As shown in FIG. 1a, a semiconductor substrate (wafer) 110 with individual devices 120 separated by streets 125 on the front side of the substrate 110. The wafer 110 can be of any desired material, such as silicon, gallium arsenide, silicon carbide and the like. Any number of separate devices 120 can be provided as part of the wafer 110. Once the front side circuitry has been completed, the substrate 110 may be thinned prior to back metal deposition on the substrate. FIG. 1b shows the semiconductor substrate 110 with a back metal layer 130 on the back side of the substrate 110.

A mask layer is deposited along the first side (front side) of the wafer and a portion of the mask is removed to leave mask deposits, thus exposing the top of the wafer as an etch window. An adhesive layer of the type that can be dissolved or whose adhesive effect can be neutralized, for example by radiation or by chemical means, may be used to adhere a carrier layer to the top surface of the wafer. The carrier layer may be a rigid plate that secures together the die of the wafer while the grinding or polishing step at the other surface of the wafer is performed. With the wafer physically supported or reinforced by the carrier layer, the second side or the bottom or rear surface of the wafer is ground back and polished to a plane. With the carrier layer still in place and securing or reinforcing the wafer, a back metal or the like may be deposited on the bottom surface of the wafer.

The back metal deposition is typically deposited on the second (back) side of the wafer—opposite the front side circuitry. There are many process flows known in the art to fabricate a thinned substrate with circuitry with back metal. The order of circuit fabrication, thinning, and metallization steps may vary depending on the specifics of the device application and substrate fabrication strategy.

Figures 2A, 2B:
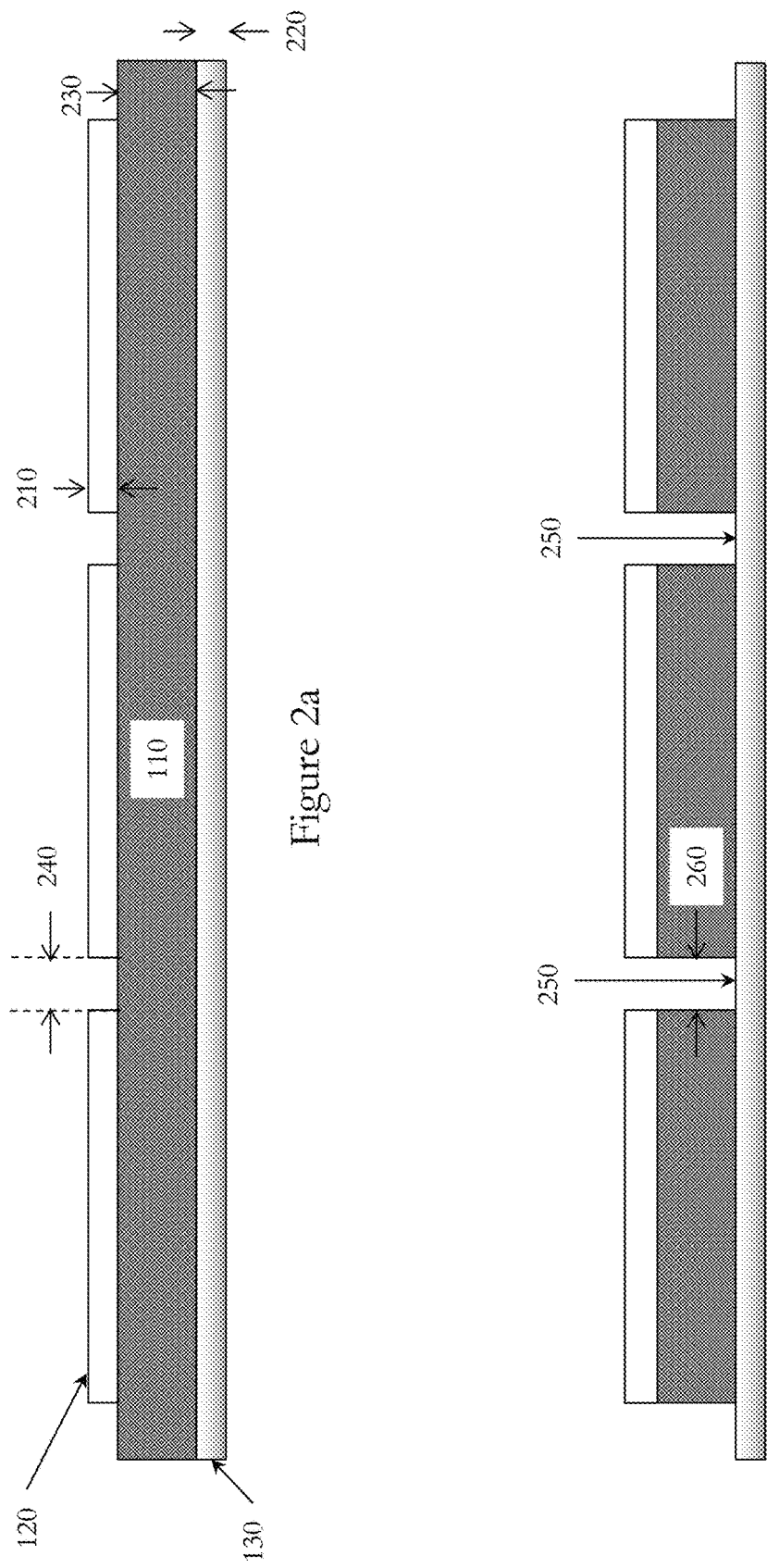
FIG. 2a is a cross-sectional view of a semiconductor substrate with back metal illustrating individual devices separated by streets.
FIG. 2b is a cross-sectional view of a semiconductor substrate with back metal illustrating individual devices separated by streets with the substrate being etched through to the back metal layer.

Once the front side circuitry has been fabricated and the back metal deposition completed, the substrate is ready for wafer dicing (die singulation). Typically, the substrate is supported during the dicing operation. This support can be in the form of a rigid carrier or a flexible membrane (e.g., dicing tape) supported by a rigid frame (e.g., dicing frame) as is known in the art. This singulation may be accomplished through mechanical means including sawing and breaking, optical means including laser ablation and stealth dicing, or chemical means including plasma dicing. A recent method of high rate plasma dicing, which has been developed by Plasma Therm LLC, can now completely etch through wafers 110 mounted on dicing tape as shown in FIG. 2a. This high rate plasma dicing, known as micro dice singulation (MDS), is a fast-switching deep silicon etch process. The result is a die singulation method that maintains smooth kerf edges, with the additional benefits of narrower kerf s, control of the wall angle, and a higher throughput. Once the die are singulated, the dicing tape is expanded for the pick and place tools just the same as any current methods of die singulation that are known in the art. To assimilate the plasma dicing process into semiconductor production, the wafers are diced on industry standard wafer frames and wafer tape. While the plasma dicing operation beneficially removes the substrate material between the die, it can be difficult for the plasma to remove the remaining backside metallization 130 connecting the die as shown in FIG. 2b.

The following describes the method to selectively remove the one to ten microns thick back metal layer 130 remaining after a deep silicon etch plasma dicing of a patterned silicon wafer 110 less than or equal to approximately two hundred fifty microns thick in order to complete the die singulation process while still being able to integrate into the standard back-end semiconductor packaging system such as pick and place. In order for the method to be successful, the back metal 130 must remain on each die and be compatible with downstream operations, while the metal between the die must be separated and/or removed.

The key to separating and/or removing the back metal 130 after the plasma dicing process is to feed a flowing fluid 320 from a fluid jet 340 at a given pressure over a mounted wafer 110 for a specified time as shown in FIGS. 3a and 3b. Specifically, once the mounted wafer 110 is removed from the plasma dicing tool, it is flipped onto a new wafer tape and frame so that the die are adhered and the back metal 130 exposed. The fluid 320 is then dispensed from the fluid jet 340 onto the exposed back metal 130 with a pressure large enough to clear the kerfs away, but not strong enough to knock the die from the wafer tape. When all the kerfs are clear of the back metal 130, the wafer 110 is ready to be expanded and then the diced packaged. The controlled variables for this solution are the fluid type, pressure/flow rate of the fluid, flow pattern, height to sample, flow angle, feed pattern relative to kerf pattern, feed rate, temperature of the fluid or sample, and exposure time.

The example above describes a process where the plasma diced wafer is inverted and reattached to dicing tape such that the back metal side of the wafer is exposed. A general flow diagram of the process according to one embodiment of the present invention is shown in FIG. 4. It is important to note that it is possible to practice the invention in a number of different hardware configurations. In an alternate embodiment, the wafer could remain on the tape carrier post plasma etch with the fluid being applied to the thin film in the street regions of the substrate from the through openings in the first surface of the substrate. In this configuration, it is preferred that the substrate support be compliant (e.g., non rigid).

In yet another configuration, after the dicing process has removed a substantial amount of the substrate material, the wafer can be mounted and held to a substrate support. The substrate support can be rigid. The substrate can be held to the support using a number of methods including pressure based (vacuum), adhesive, or electrostatic means. The substrate can be mounted with second side of the substrate being exposed to the fluid jet.

The process most likely will require a flip of the wafer after the deep silicon etch process and then placed on a tool that passes the fluid over the back metal. Once the back metal has been selectively separated and/or removed, the singulated die can then be expanded and sent into a downstream packaging work flow.

At least one device is fabricated on a wafer where the wafer contains device regions and street regions. There can be lots of device types of semiconductor devices such as Integrated circuits (ICs), Micro-Electro-Mechanical-Systems (MEMS) devices, Optical devices, etc. The wafer types to support different device types can be Semiconductor (e.g., Si, Ge, etc.); Compound Semiconductor (e.g., GaAs, InP, GaN, SiC, etc.); Insulating (e.g., Quartz, Pyrex, etc.); or Conducting (e.g., metal, etc.).

The street regions are removed or broken to allow separation of individual die. The separated die will become a functioning device or part of a larger device which are packaged as individual device or integrated with other die to form lager device.

A substrate with a second surface (front) opposed to a first surface (back) with a thin film on the second surface. The thin film can be a composite stack, could contain metal (e.g., Au, Ag, Al, or Cu). The coverage of the thin film on the second surface of the substrate corresponds to a portion of the street area on the first surface (e.g., the thin film on the second surface of the substrate has some degree of overlap with the street regions as defined on the front (first) surface of the substrate). The thin film can be less than approximately twenty microns thick, preferably one to five microns thick. The etch process to remove material from the street region of the wafer from the first side can be chemical etching (e.g., plasma etching using the Bosch process). Alternately, the etch process to remove material from the street region can be through the use of a laser. Plasma etching can result in sloped features, vertical features or features with a retrograde (e.g., undercut) profile. The chemical etching process can contain a halogen containing etchant. The etch process can be selective to the thin film with a thin film: substrate selectivity >10:1; a selectivity >100:1 or 1000:1. Etch selectivity can be a ratio of the film etch rate to the substrate etch rate. The substrate removal process leaves at least a portion of the thin film overlapping the street region. The etching process can expose a portion of the thin film from the first surface of the substrate. The thin film substantially can be unsupported by the substrate in at least some portion or all of the street regions.

The substrate can be held on a substrate support. The substrate support can contain an adhesive such as dicing tape. The substrate support can have an electrostatic chuck and/or a vacuum chuck. The substrate support is in contact with the first side of the substrate (front). A fluid dispensed from a fluid jet is applied to a portion of the thin film where the fluid pressure of the dispensed fluid from the fluid jet can be greater than the thin film ultimate tensile strength. The fluid pressure of the dispensed fluid from the fluid jet can be less than the thin film to substrate adhesion strength.

The wafer could be die side up or die side down when it is being exposed to the dispensed fluid from the fluid jet. Wafers exit the micro dice singulation tool die side up. Die side down may require the substrate to be inverted between the removal of the substrate material in the street and application of the fluid jet to the thin film.

The fluid from the fluid jet imparts a force onto the thin film that will damage or remove the film. The type of dispensed fluid from the fluid jet could be Compressed Air, Nitrogen, Argon, or Deionized Water. The fluid pressure of the dispensed fluid from the fluid jet can be greater than the ultimate tensile strength of the kerf. The ultimate tensile strength of the thin film is based on the material composition, the kerf width, and thickness of the thin film (e.g., back metal). If the pressure of the dispensed fluid from the fluid jet is too great, then the fluid jet may damage the singulated device. This damage may come in the form of removing the singulated die from the substrate support (e.g., dicing tape). Alternatively, the damage may come in the form of removing portions of the thin film from the final device. The flow pattern of the fluid of the dispensed fluid from the fluid jet can be chosen from a wide range of geometries including: straight cylindrical, flat fan, cone, or square which is dependent on the fluid nozzle on the fluid jet. The height that the fluid is expressed from the nozzle of the fluid jet relative to the wafer directly increases or decreases the pressure of the fluid that is applied to the wafer. Typically the fluid jet is expressed less than 25 cm from the wafer surface. In a preferred embodiment, the fluid jet is expressed at a height less than 3 cm from the wafer surface. In fluid jet configurations where the spray pattern is diverging, the height that the fluid is expressed from the nozzle of the fluid jet relative to the wafer also adjusts the amount of surface area on the wafer that will be affected by the expressed fluid from an individual fluid jet. A balance between pressure and exposure of the dispensed fluid from the fluid jet is necessary for efficiently separating back metal on the substrate.

The fluid jet can express the fluid at a nearly monodisperse angle (e.g., near unidirectional stream) or in a pattern that contains a distribution of fluid velocities and directions (e.g., a conical or fan shaped nozzle). The nozzle of the fluid jet can be tilted so that the flow of fluid from the fluid jet can be optimized for kerf clearing on the substrate. The feed rate of the fluid flow pattern from the fluid jet over the wafer can be optimized for kerf clearing on the substrate. The fluid dispensed from the fluid jet can be optimized for temperature of the fluid and the exposure time of the back metal to the fluid for optimized kerf clearing on the substrate.

The fluid dispensed from the fluid jet is applied to the thin film. In one embodiment, the fluid is dispensed to the second surface of the substrate. In applying the fluid dispensed from the fluid jet to the second surface, the dispensed fluid jet dimension can be:

1. greater than the street width on the substrate;
2. greater than one die dimension on the substrate;
3. covering a portion of at least one die on the substrate; or
4. less than the dimension of the substrate.

In applying the fluid dispensed from the fluid jet to the second surface of the substrate, the substrate can be moved relative to the fluid jet. The fluid jet can be moved relative to the substrate and the movement may be coplanar or non-coplanar. The fluid jet and the substrate can both be moved relative to one another during the application of the fluid dispensed from the fluid jet to the substrate.

In applying the fluid dispensed from the fluid jet to the surface of the substrate, the fluid dispensed from the fluid jet can be discontinuous and/or pulsed. The pulsing of the fluid dispensed from the fluid jet can be varied based on jet pressure and/or flow rate of the fluid dispensed from the fluid jet.

In applying the fluid dispensed from the fluid jet to the second surface of the substrate, the fluid dispensed from the fluid jet can be shaped:

1. symmetric in at least one dimension;
2. conical—hollow and/or solid cone
3. fan shaped;
4. asymmetric in at least one dimension; or
5. a curtain, which can be a linear curtain.

The fluid jet can be comprised of multiple individual fluid jets. The fluid jet can be comprised of an array of jets that can be arranged as a linear array. The array can be a two dimensional array that can be regularly or irregularly spaced. The area of the array of jets can be larger or smaller than the substrate area. The array of jets can be moved relative to the substrate, moved linearly and/or rotationally. The substrate may be moved relative to the array of jets, moved linearly and/or rotationally.

In applying the fluid dispensed from the fluid jet to the second surface of the substrate, the fluid dispensed from the fluid jet may impact the second surface of the substrate at a near normal incidence or at another prescribed angle of incidence. The dispensed fluid from the fluid jet may be substantially unidirectional. In applying the fluid dispensed from the fluid jet to the second surface of the substrate, the fluid dispensed from the fluid jet may impact the substrate at a plurality of angles. The angle that the fluid is dispensed from the fluid jet to the second surface of the substrate may be adjustable. The angle that fluid is dispensed from the fluid jet to the second surface of the substrate may be moveable relative to the surface of the substrate. The substrate may be moveable relative to the fluid nozzle of the fluid jet. Both the substrate and the fluid nozzle of the fluid jet may be movable relative to each other. The angle that the fluid is dispensed from the fluid jet to the second surface of the substrate may be variable over time.

In one embodiment where the fluid jet impinges on areas of the wafer where the thin film has been separated, it is preferred that the angle of fluid impinging on the separated die is less than approximately 45 degrees from normal incidence. This limitation in angle reduces the likelihood that the pressure from the fluid jet will cause the separated die to be removed from the substrate support during the fluid jet operation (e.g., at off normal angles, the fluid jet may cause the singulated die to lose adhesion to the dicing tape and be lost).

The height at which fluid is dispensed from the nozzle of the fluid jet relative to the surface of the substrate may be adjustable. The height at which fluid is dispensed from the nozzle of the fluid jet relative to the surface of the wafer can be held constant during the thin film singulation process. The height at which fluid is dispensed from the nozzle of the fluid jet relative to the surface of the wafer can be varied during the back metal process.

The temperature of the fluid dispensed from the fluid jet can be controlled. The fluid dispensed from the fluid jet can contain a liquid (e.g., water), a solid and/or gas (e.g., nitrogen). The fluid dispensed from the fluid jet can contain droplets. The droplets can be less than approximately one mm in diameter. The droplets can be less than one hundred microns in diameter. The fluid dispensed from the fluid jet can contain gas bubbles in a liquid. The fluid dispensed from the fluid jet can contain immiscible liquids, surfactants and/or anti-corrosion additives. The fluid dispensed from the fluid jet can be an aerosol.

The fluid jet energy flux as dispensed from the fluid jet can be sufficient to damage the thin film. The fluid jet energy flux as dispensed from the fluid jet can remove a portion of the thin film. The fluid jet energy flux as dispensed from the fluid jet can damage a portion of the thin film.

The thin film separation width may be defined by the dicing width on the substrate. The film separation dimension on the substrate is less than the street region. The film separation dimension on the substrate may be equal to the street region. Minimal film separation or damage in the die region can occur or no film separation in the die region can occur. Any film damage that may occur in the die region does not impair device performance.

It is important to note that while the method above describes the fluid jet technique in conjunction with plasma etch singulation, the fluid jet method is compatible with all singulation techniques that remove substantially all the wafer material leaving a thin film connecting the die. The method is particularly relevant for use with dicing techniques that leave a thin film substantially unsupported by the substrate between the die.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,
What is claimed is:

1. A method for dicing a substrate with back metal, the method comprising:
   providing a substrate support having an electrostatic chuck;
   providing the substrate having a first surface and a second surface, said second surface being opposite to said first surface, a mask layer on said first surface of the substrate, the back metal layer on said second surface of the substrate;
   dicing said first surface of the substrate through said mask layer to expose the back metal layer on said second surface of the substrate;
   electrostatically clamping the substrate to the electrostatic chuck; and
   damaging a portion of the back metal layer by applying a fluid from a fluid jet to the back metal layer on said second surface of the substrate after the back metal layer has been exposed by the dicing step, said fluid from said fluid jet being applied to the substrate while the substrate is electrostatically clamped to the electrostatic chuck.

2. The method according to claim 1 wherein the back metal layer being approximately one to five microns thick.

3. The method according to claim 1 wherein said fluid from said fluid jet being dispensed at an angle less than 45 degrees from normal incidence to the back metal layer of the substrate.

4. The method according to claim 1 further comprising controlling the temperature of said fluid from said fluid jet.

5. The method according to claim 1 wherein said fluid jet being pulsed during the application of said fluid to the back metal layer.

6. The method according to claim 1 wherein said fluid from said fluid jet being dispensed in a fan shape during the application of said fluid to the back metal layer.

7. The method according to claim 1 wherein said fluid from said fluid jet being dispensed at a fluid jet area, said fluid jet area being larger than a substrate area.

8. The method according to claim 1 wherein said fluid from said fluid jet being dispensed at a fluid jet area, said fluid jet area being smaller than a substrate area.

9. The method according to claim 1 further comprising moving said fluid jet relative to the substrate.

10. The method according to claim 9 further comprising moving the substrate relative to said fluid jet.

11. The method according to claim 1 further comprising applying the fluid from said fluid jet symmetrically in at least one direction.

12. The method according to claim 1 further comprising applying the fluid from said fluid jet asymmetrically in at least one direction.

13. The method according to claim 1 further comprising exposing the back metal layer from said first surface.

* * * * *